United States Patent
Hammerschmidt

(10) Patent No.: US 10,612,944 B2
(45) Date of Patent: Apr. 7, 2020

(54) ELECTRIC SHIELD BETWEEN MAGNETO-RESISTIVE SENSOR ELEMENTS

(71) Applicant: Infineon Technologies AG, Neubiberg (DE)

(72) Inventor: Dirk Hammerschmidt, Finkenstein (AT)

(73) Assignee: Infineon Technologies AG, Neubiberg (DE)

( * ) Notice: Subject to any disclaimer, the term of this patent is extended or adjusted under 35 U.S.C. 154(b) by 74 days.

(21) Appl. No.: 15/463,499

(22) Filed: Mar. 20, 2017

(65) Prior Publication Data
US 2017/0276520 A1 Sep. 28, 2017

(30) Foreign Application Priority Data
Mar. 22, 2016 (DE) .......................... 10 2016 105 380

(51) Int. Cl.
| | | |
|---|---|---|
| G01D 5/244 | (2006.01) | |
| G01R 33/09 | (2006.01) | |
| G01D 5/16 | (2006.01) | |

(52) U.S. Cl.
CPC ........... G01D 5/24428 (2013.01); G01D 5/16 (2013.01); G01R 33/09 (2013.01)

(58) Field of Classification Search
CPC ....... G01D 5/24428; G01D 5/16; G01R 33/09
See application file for complete search history.

(56) References Cited

U.S. PATENT DOCUMENTS

| | | | |
|---|---|---|---|
| 6,404,604 B2 | 6/2002 | Odai et al. | |
| 6,507,466 B1 | 1/2003 | Hayashi et al. | |
| 7,382,585 B1* | 6/2008 | Nibarger | G11B 5/00878 360/316 |
| 8,208,228 B2* | 6/2012 | Maat | B82Y 10/00 360/314 |
| 8,891,207 B1* | 11/2014 | Li | G11B 5/115 360/121 |
| 9,488,701 B2 | 11/2016 | Lee et al. | |
| 9,618,589 B2 | 4/2017 | Zimmer et al. | |
| 2006/0262585 A1 | 11/2006 | Lenssen | |
| 2008/0211490 A1 | 9/2008 | Kurata et al. | |
| 2009/0207534 A1 | 8/2009 | Miyauchi et al. | |
| 2014/0285032 A1 | 9/2014 | Zannoth | |
| 2015/0108972 A1* | 4/2015 | Zimmer | G01R 33/093 324/252 |

* cited by examiner

Primary Examiner — Walter L Lindsay, Jr.
Assistant Examiner — Milton Gonzalez
(74) Attorney, Agent, or Firm — Eschweiler & Potashnik, LLC

(57) ABSTRACT

An integrated circuit including a magneto-resistive stack of ferromagnetic and non-magnetic layers formed on a common substrate. The integrated circuit includes at least a first magneto-resistive sensor element provided by a first section of the magneto-resistive stack, at least a second magneto-resistive sensor element provided by a separate second section of the magneto-resistive stack, and a shield element provided by a separate third section of the magneto-resistive stack between the first and the second section. The shield element is configured to operate as an electric shield between the at least one first and the at least one second magneto-resistive sensor elements.

20 Claims, 6 Drawing Sheets

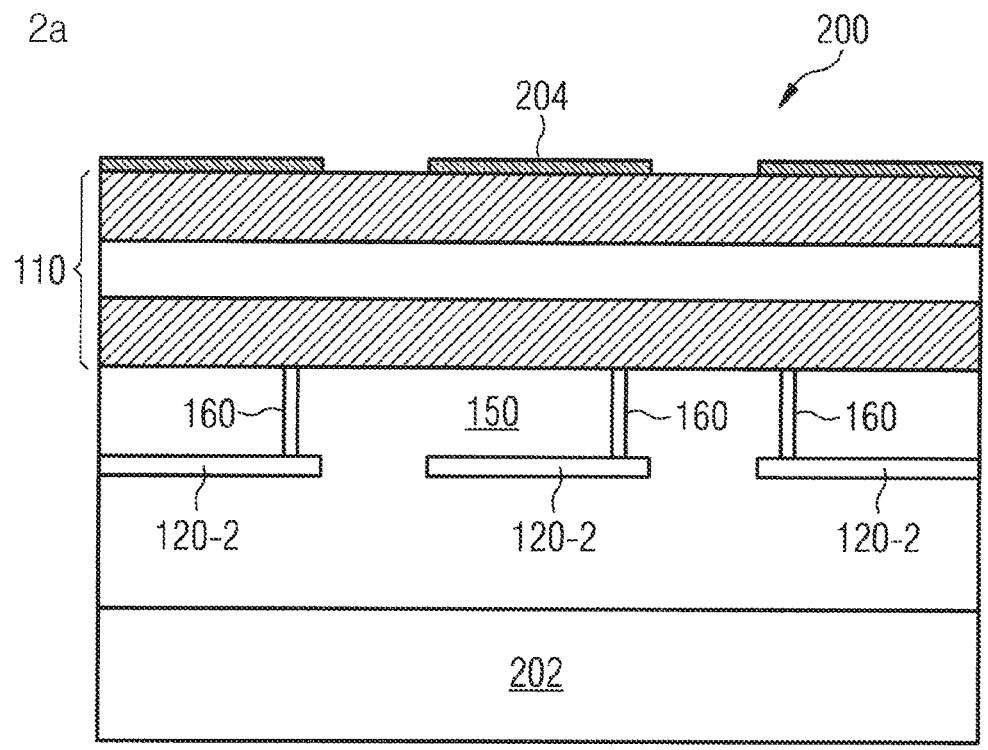
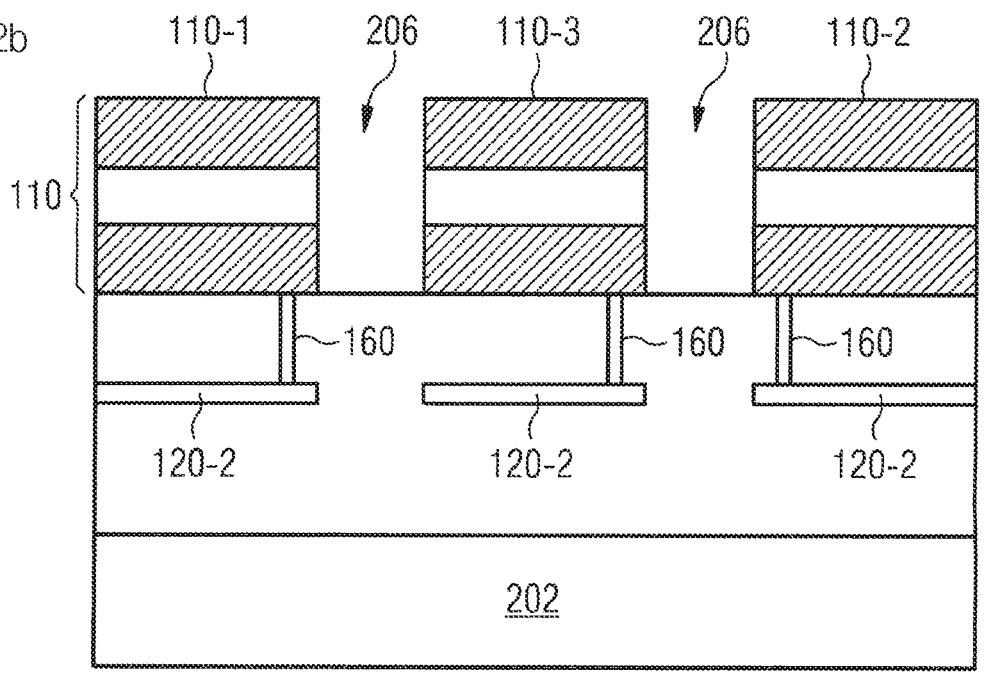

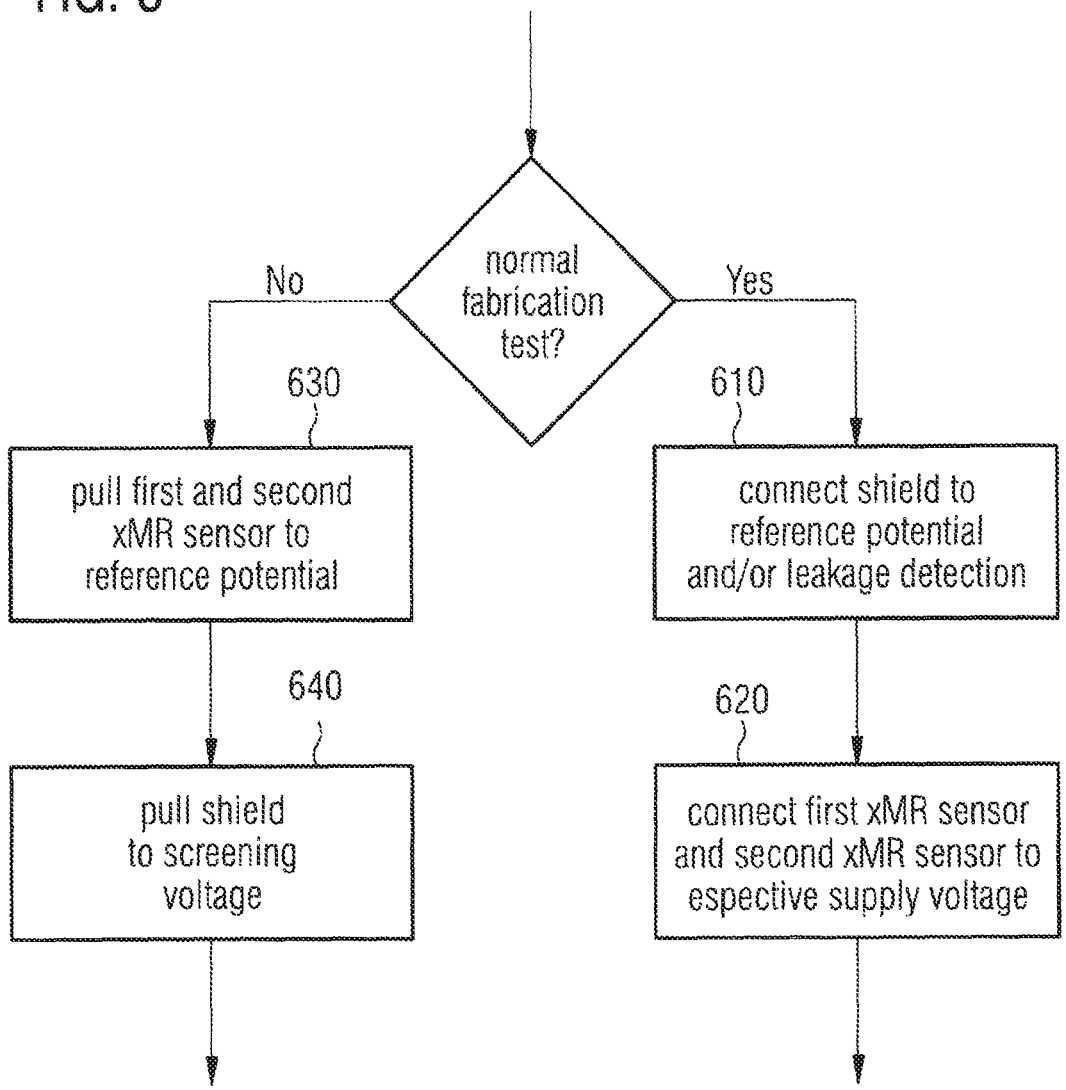

ELECTRIC SHIELD BETWEEN MAGNETO-RESISTIVE SENSOR ELEMENTS

CROSS REFERENCE TO RELATED APPLICATIONS

This application claims priority to German Application number 10 2016 105 380.5 filed on Mar. 22, 2016, the contents of which are incorporated by reference in their entirety.

FIELD

Embodiments of the present disclosure generally relate to sensor devices and, more particularly, to magneto-resistive sensor devices.

BACKGROUND

Today, sensors are applied in numerous applications, such as, for example, automotive applications. Safety critical applications, such as Anti-Blocking Systems (ABS) or Electrical Power Steering (EPS), for example, often rely on redundant sensor concepts to achieve sufficiently low probabilities of random hardware failures. Such redundant sensor concepts may use dual-sensor solutions with two redundant sensors instead of one. Dual-sensor packages may integrate two sensors with respective separate power supplies and separate signal outputs. The sensors are electrically independent due to galvanic isolation. This means that the two sensors work independently, thereby increasing system reliability.

In particular, integrated magneto-resistive sensors are predestinate for this kind of redundancy since they are small and can be located over circuitry. Magneto-resistive sensors can include Giant Magneto-Resistive (GMR), Tunnel Magneto-Resistive (TMR), Anisotropic Magneto Resistive (AMR) and other well-known magneto-resistive technologies, referred to collectively as XMR technologies. Furthermore XMR support the integration of electrically independent sensors on a single chip, since the du not use the silicon bulk and are thus galvanically isolated by isolators like oxides or nitrides.

Redundant sensor concepts require sufficient independency of the redundant sensor elements. A reason for dependent faults affecting either one or the other sensor may be a shortcut or leakage through isolation layers between the two magneto-resistive sensors which may, for example, be supported by defects or contamination that reduces the isolation capability of the used separation or insulation material, for example, oxide or nitride. Such defects do often not lead to safety critical leakage immediately, but may be activated during operation after some time in an electrical field.

One way to reduce the probability of shortcuts or leakage through separation or insulation layers could be to increase the distance between the adjacent sensors. However, this would be costly since the area between the magneto-resistive structures would be comparable or even larger than the magneto-resistive elements themselves.

Thus, there is a need for improved concepts for reducing the probability of shortcuts or leakage between magneto-resistive sensors of redundant sensor Integrated Circuits (ICs).

SUMMARY

Embodiments of the present disclosure propose to use a magneto-resistive structure as an electric or electro-magnetic shield between two magneto-resistive sensor elements. The magneto-resistive shield structure can be formed using the same fabrication technologies as is used for fabricating the magneto-resistive sensor elements. No additional fabrication technologies may be required for the shield structure.

According to a first aspect of the present disclosure, it is provided an integrated circuit comprising a magneto-resistive stack of ferromagnetic and non-magnetic layers formed on a common substrate. The integrated circuit comprises at least one first magneto-resistive sensor element provided by or implemented in a first section of the magneto-resistive stack. The integrated circuit comprises at least one second magneto-resistive sensor element provided by or implemented in a separate second section of the magneto-resistive stack. Further, the integrated circuit comprises at least one shield element provided by or implemented in a separate third section of the magneto-resistive stack between the first and the second section. The shield element can be used as an electric shield between the at least one first and the at least one second magneto-resistive sensor element during operation of the at least one first and the at least one second magneto-resistive sensor element, for example.

Operation of the at least one first and the at least one second magneto-resistive sensor element may be understood as providing the at least one first and the at least one second magneto-resistive sensor element with respective supply voltages or currents, for example.

In some embodiments, the separate first, second, and third magneto-resistive stack sections can originate from an originally contiguous magneto-resistive stack separated into the different sections or portions during fabrication of the integrated circuit.

In some embodiments, the common substrate can be a semiconductor substrate, such as silicon, for example. Further integrated circuit portions interfacing the magneto-resistive sensor elements and/or the shield element can be implemented in the common substrate. Thus, the integrated circuit including the magneto-resistive sensor elements and the (magneto-resistive) shield element can be implemented on one common semiconductor chip.

In some embodiments, the at least one first magneto-resistive sensor element and the at least one second magneto-resistive sensor element can be parts of respective bridge circuits including the respective magneto-resistive sensor element. Thus, the expression "at least one first magneto-resistive sensor element" also comprises a first magneto-resistive bridge circuit and the expression "at least one second magneto-resistive sensor element" also comprises a second magneto-resistive bridge circuit. Examples of bridge circuits are Wheatstone bridges and modifications thereof.

In some embodiments, the first section of the magneto-resistive stack can be separated from the third section of the magneto-resistive stack by an isolating or insulating material, such as oxide or nitride. Likewise, the third section of the magneto-resistive stack can be separated from the second section of the magneto-resistive stack by the insulating material.

In some embodiments, the at least one first magneto-resistive sensor element and the at least one second magneto-resistive sensor element can be configured to sense the same magnetic field independently from each other. Thus, the integrated circuit can comprise a redundant sensor IC, such as a dual-sensor IC.

In some embodiments, the integrated circuit can further comprise one or more electrical connectors to or from at least one of the first magneto-resistive sensor element, the second magneto-resistive sensor element, or the shield element. The one or more electrical connectors or pads can be configured as an interface between the integrated circuit and an external circuit. Thus signals can be supplied to/from at least one of the first magneto-resistive sensor element, the second magneto-resistive sensor element, or the shield element from/to the external circuit.

In some embodiments, the integrated circuit can further comprise at least one common contact pad (e.g., for a common supply and/or a common ground) shared by the first and the second magneto-resistive sensor element. This common contact pad of the sensors is however electrically separate from any contact pads of the shield element.

In embodiments directed to redundant sensor ICs, for example, the integrated circuit can further comprise verification circuitry configured to compare a first sensor signal generated by the at least one first magneto-resistive sensor element or associated readout circuitry against a second sensor signal generated by the at least one second magneto-resistive sensor element or associated readout circuitry in response to a magnetic field applied to a respective sensing or free layer of the at least one first and at least one second magneto-resistive sensor element. In case the verification yields a deviation between the first and the second sensor signal above a certain threshold, an error event may be signaled, for example.

In some embodiments, the integrated circuit can further comprise switching circuitry configured to couple or pull electrical connectors of the shield element to a reference potential during operation of the at least one first and the at least one second magneto-resistive sensor element. In this way, for example, all electrically conductive layers of the shield element's magneto-resistive layer stack, thus the complete shield element, may be coupled to ground potential during operation of the at least one first and the at least one second magneto-resistive sensor element. Further, the switching circuitry can be configured to couple or pull the electrical connectors of the shield element to a screening potential during a screening mode of the integrated circuit. 'Screening' or 'stress screening' is referred to herein as methods for defect screening of ICs for the purposes of preventing defects in microelectronic circuits from getting into the field where they can cause reliability fails. In one example, the screening mode implements a current leakage screen. For example, all electrically conductive layers of the shield element's magneto-resistive layer stack, thus the complete shield element, can be coupled or pulled to the screening potential during the screening mode. Thus, the integrated circuit may be operated in at least two different modes: Operation of the at least one first and the at least one second magneto-resistive sensor element (sensing mode) and screening mode of the integrated circuit.

In some embodiments, the switching circuitry can be configured to couple or pull respective electrical connectors of the at least one first and the at least one second magneto-resistive sensor element to the reference potential during the screening mode. In this way, for example, all electrical connectors and thus all electrically conductive layers of at least one first and the at least one second magneto-resistive sensor element's magneto-resistive layer stack, thus the respective complete magneto-resistive sensor element, may be coupled to ground potential during the screening mode.

In some embodiments, the switching circuitry can be configured to couple the at least one first and the at least one second magneto-resistive sensor element between a respective supply potential and the reference potential during operation of the at least one first and the at least one second magneto-resistive sensor element. During operation of the at least one first and the at least one second magneto-resistive sensor element, the at least one first and the at least one second magneto-resistive sensor element may be configured to sense a magnetic field, respectively. The respective sensed magnetic field may be the same magnetic field in dual-sensor solutions.

In some embodiments, the screening potential can be larger than a supply potential used for operating the first and/or the second magneto-resistive sensor element but lower than a breakdown voltage of one or more Electro-Static Discharge (ESD) circuits associated with the shield element and/or the at least one first magneto-resistive sensor element and/or the at least one second magneto-resistive sensor element. The higher screening potential may cause a strong electric field to activate and grow conductive contamination defects in insulation or separation material between the magneto-resistive sensor elements and the shield element.

In some embodiments, the shield element can be coupled to at least one metal layer or line of the integrated circuit by a plurality of vias (or cuts) between the at least one metal layer or line and the shield element. The plurality of vias may form a via-grid or shield between the at least one first and the at least one second magneto-resistive sensor element. Thus, electric shielding may be further improved.

In some embodiments, the integrated circuit can further comprise leakage detection circuitry coupled to the shield element. The leakage detection circuitry may be configured to detect an occurrence of leakage current between the shield element and at least one of the first and the second magneto-resistive sensor element. The leakage detection circuitry may be configured to detect the occurrence of leakage current during the screening mode and/or during the sensing mode.

In some embodiments, the shield element can be coupled between a first electrical contact and a second electrical contact. The first and second electrical contacts may be located on opposing ends of the shield element. In this way, the shield element together with appropriate detection circuitry can be configured to detect cracks in the magneto-resistive stack based on evaluating an electrical current through the shield element in response to a crack detection voltage or current applied between the first and the second electrical contact during the screening mode or another a test mode.

In some embodiments, a portion of the third section of the magneto-resistive stack can be configured as a shunt resistor. Thus, at least a portion of the shield element may be used as shunt resistor. Alternatively, an external shunt resistor may be coupled to the shield element for detecting voltage drops to due leakage current.

In some embodiments, the at least one first and the at least one second magneto-resistive sensor element can be configured as AMR, GMR, or TMR sensor elements. Thus, magneto-resistive stack in the common substrate may be configured as AMR-, GMR-, or TMR-stack. Stacks based on other magneto-resistive effects are also possible.

According to a further aspect of the present disclosure, it is provided a sensor circuit comprising a stack of ferromagnetic and non-magnetic layers formed on a common substrate. The sensor circuit comprises at least a first magneto-resistive sensor element provided by a first section of the layer stack and at least a second magneto-resistive sensor element provided by a separate second section of the layer stack. Further, the circuit comprises at least one shield element provided by a separate third section of the layer stack between the first and the second section. The shield element can act as an electric shield between the at least one first and the at least one second magneto-resistive sensor element during operation of the at least one first and the at least one second magneto-resistive sensor element. The sensor circuit further comprises switching circuitry which is configured to pull the shield element to ground (e.g., by connecting all its electrical contacts to ground) during operation of the at least one first and the at least one second magneto-resistive sensor element and to pull the shield element to a screening potential (e.g., by connecting all its electrical contacts to the screening potential) during a screening mode of the circuit. In some embodiments, at least the first magneto-resistive sensor element, the second magneto-resistive sensor element, and the shield element can be integrated into a common integrated circuit portion.

In some embodiments, the shield element comprises the same ferromagnetic and non-magnetic layers of the layer stack as the first and second magneto-resistive sensor element. Thus, the shield element, the first magneto-resistive sensor element, and the second magneto-resistive sensor element may be based on the same XMR technology.

According to yet a further aspect of the present disclosure, it is provided a method for operating an integrated sensor device comprising a magneto-resistive stack of ferromagnetic and non-magnetic layers formed on a common substrate, wherein the sensor device comprises at least a first magneto-resistive sensor element provided by a first section of the magneto-resistive stack, at least a second magneto-resistive sensor element provided by a separate second section of the magneto-resistive stack, and a shield element provided by a separate third section of the magneto-resistive stack between the first and the second section. The method includes, during operation of the at least one first and the at least one second magneto-resistive sensor element:

connecting the shield element to a reference potential and/or to leakage detection circuitry to detect leakage current between the shield element and at least one of the first and the second magneto-resistive sensor element; and connecting the at least one first magneto-resistive sensor element and the at least one second magneto-resistive sensor element to a supply potential and, optionally, to respective readout circuitry.

Here, operation of the at least one first and the at least one second magneto-resistive sensor element may be understood as a mode of regular operation in which the at least one first and the at least one second magneto-resistive sensor element and respective readout circuitry sense a magnetic field.

In some embodiments, the method further includes, during a screening mode of the integrated sensor device, pulling (for example, by connecting all electrical contacts of) the at least one first magneto-resistive sensor element and of the at least one second magneto-resistive sensor element to a common reference potential and connecting the shield element to a screening voltage higher than an operating supply voltage used for operating the first and/or the second magneto-resistive sensor element.

In some embodiments, the method further includes, in response to the applied screening voltage, checking for leakage current between the shield element and at least one of the first and the second magneto-resistive sensor element during the screening mode.

In some embodiments, the method further includes, during the screening or another a test mode of the integrated sensor device, electrically coupling the shield element between a first electrical contact and a second electrical contact, applying a crack detection voltage or current between the first and the second electrical contact, detecting cracks in the magneto-resistive stack or the common substrate based on evaluating an electrical current through the shield element in response to the crack detection voltage or current.

According to another aspect of the present disclosure, it is provided a method for fabricating an integrated sensor device. The method includes forming a magneto-resistive stack of ferromagnetic and non-magnetic layers on a common substrate, forming at least one first magneto-resistive sensor element in a first section of the magneto-resistive stack, forming at least one second magneto-resistive sensor element in a separate second section of the magneto-resistive stack, and forming a shield element operable as an electric shield between the at least one first and the at least one second magneto-resistive sensor element in a separate third section of the magneto-resistive stack between the first and the second section.

In some embodiments, the method further includes separating the first section of the magneto-resistive stack from the third section of the magneto-resistive stack by an insulating material and separating the third section of the magneto-resistive stack from the second section of the magneto-resistive stack by an or the insulating material. In some embodiments, the separation may be performed by etching gaps into the magneto-resistive stack and filling the gaps between the resulting separate sections/portions of the stack with insulating material, such as oxide or nitride.

In some embodiments, the method further includes connecting one or more electrical contacts of the shield element to ground potential during plasma etching.

In some embodiments, the method further includes integrating first readout circuitry associated with the at least one first magneto-resistive sensor element in the common substrate and integrating second readout circuitry associated with the at least one second magneto-resistive sensor element in the common substrate.

In some embodiments, the method further includes integrating, in the common substrate, leakage current detection circuitry for detecting leakage current between the shield element and at least one of the first and the second magneto-resistive sensor element.

In some embodiments, the method further includes, during the screening or another a test mode of the integrated sensor device, electrically coupling the shield element between a first electrical contact and a second electrical contact, applying a crack detection voltage or current between the first and the second electrical contact, and detecting cracks in the magneto-resistive stack based on evaluating an electrical current through the shield element in response to the applied crack detection voltage or current.

In some embodiments, the method further includes, during a screening mode of the integrated sensor device, connecting or pulling the at least one first magneto-resistive sensor element and of the at least one second magneto-resistive sensor element to a common reference potential, connecting or pulling the shield element to a screening voltage higher than an operating supply voltage used for operating the first and/or the second magneto-resistive sensor element, and, in response to the applied screening voltage, checking for leakage current between the shield element and at least one of the first and the second magneto-resistive sensor element during the screening mode.

Some embodiments provide a structure that allows to apply increased voltage stress to allow accelerated activation of extrinsic defects in insulation material (for example, oxide) and reconfigure it afterwards to serve as a shield between redundant sensor elements. Thus, some embodiments provide structures and methods for combined extrinsic defect screening and functional isolation of XMR sensors.

BRIEF DESCRIPTION OF THE DRAWINGS

Some embodiments of apparatuses and/or methods will be described in the following by way of example only, and with reference to the accompanying figures, in which

FIGS. 2a and 2b illustrate a method for fabricating an integrated sensor device according to an embodiment;

FIG. 6 shows a flow-chart of a method for operating an integrated sensor device according to an example embodiment.

DETAILED DESCRIPTION

Various example embodiments will now be described more fully with reference to the accompanying drawings in which some example embodiments are illustrated.

Accordingly, while further embodiments are capable of various modifications and alternative forms, some example embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers can refer to like or similar elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of further example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1A:
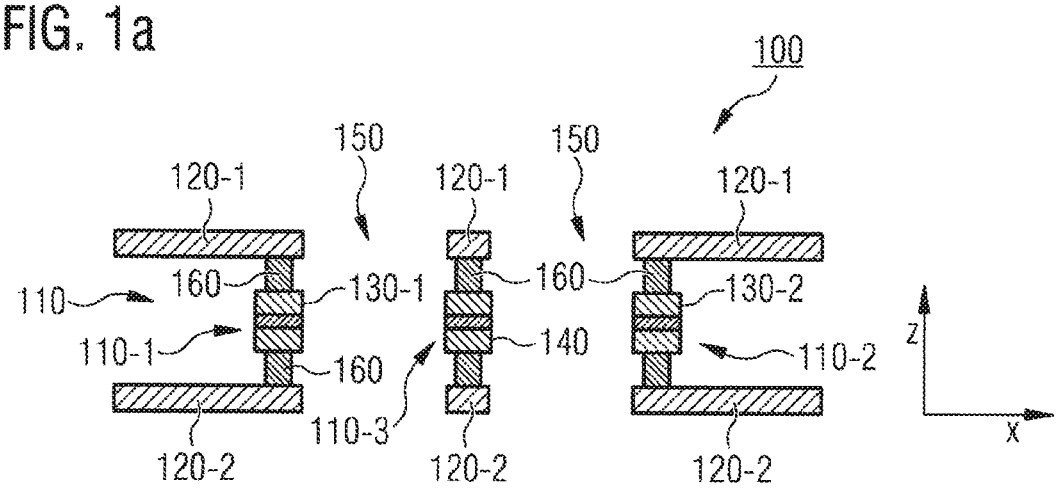
FIGS. 1a and 1b shows side and top views, respectively, of a portion of an integrated sensor circuit according to an example embodiment.
Figure 1B:
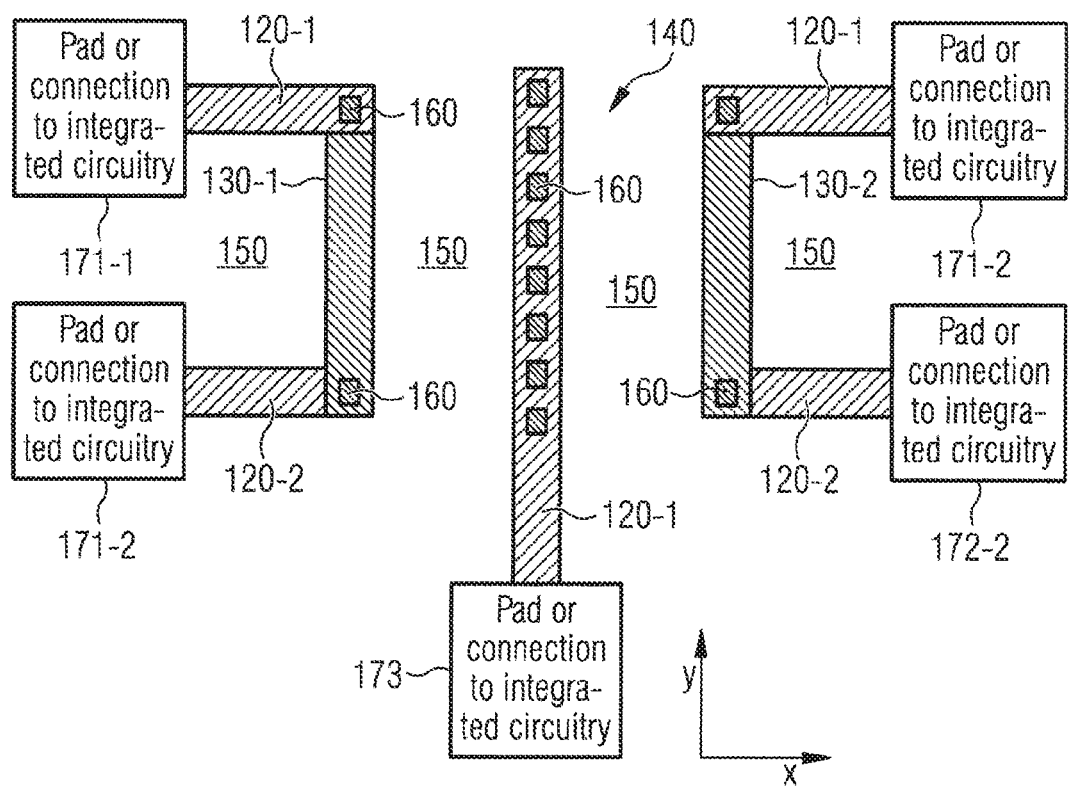

Turning now to FIGS. 1a and 1b, it is schematically shown a section of an integrated sensor circuit 100 according to an example. While FIG. 1a presents a side view of the integrated sensor circuit 100, FIG. 1b presents a corresponding top view.

The integrated sensor circuit 100 comprises a magneto-resistive stack 110 of alternating ferromagnetic and non-ferromagnetic layers formed on a common substrate (not shown). The common substrate of integrated sensor circuit 100 may be a semiconductor substrate, such as, for example, a silicon wafer. The semiconductor wafer may form the basis for the integrated sensor circuit 100. In the illustrated example, the magneto-resistive stack 110 is implemented between an upper metal layer or line 120-1 and a lower metal layer or line 120-2 of the integrated sensor circuit 100. This configuration between metal layers may be used for so-called CPP (Current Perpendicular to Plane) geometries of magneto-resistive stacks. In other embodiments related to so-called CIP (Current In Plane) geometries, the magneto-resistive stack 110 could also be implemented below or above a metal layer to be contacted from only one side (top or bottom).

The magneto-resistive stack 110 comprises three separate portions or sections 110-1, 110-2, and 110-3. The skilled person having benefit from the present disclosure will appreciate that the three separate portions or sections 110-1, 110-2, and 110-3 may originate from the same magneto-resistive stack 110, which will be explained further below. A composition of layers 20 of the magneto-resistive stack 110 may be chosen in various different ways to obtain different magneto-resistive effects. In some examples, ferromagnetic and non-magnetic layers may be combined such as to implement the magneto-resistive stack 110 according to the AMR, the GMR, or the TMR effect.

In some example embodiments, the magneto-resistive stack 110 may comprise an antiferromagnetic pinning layer, a ferromagnetic pinned layer, a diamagnetic coupling layer, a ferromagnetic reference layer with a reference magnetization having a linear or straight pattern, an electrically insulating tunnel barrier or diamagnetic layer, and a ferromagnetic free layer. The skilled person having benefit from the present disclosure will appreciate that the above composition of layers is merely one of many possibilities to form XMR sensor elements. A reverse composition is possible as well, for example. For example, the free layer may be comprised of a composition of ferromagnetic and non-magnetic layers. A free layer composed of a multilayer structure with layers with a conductivity close to the coupling layer and layers with small conductivity further away from the coupling may be beneficial for the application. The free layer or the pinned layer may by a multilayer structures comprising spin injections layers leading to a high spin polarization. Without loss of generality let us assume that the magneto-resistive stack 110 of the example of FIGS. 1a and 1b is a TMR stack.

At least a first magneto-resistive sensor element 130-1 is provided by the first portion 110-1 of the magneto-resistive stack 110. At least a second magneto-resistive sensor element 130-2 is provided the separate second portion 110-2 of the magneto-resistive stack 110. A shield element or structure 140 is provided by the separate third portion 110-3 of the magneto-resistive stack 110. In the illustrated example, the first magneto-resistive sensor element 130-1, the second magneto-resistive sensor element 130-2 as well as the shield element 140 are TMR structures. However, as mentioned above, any other magneto-resistive structure are possible as well.

The third portion 110-3, thus the shield element 140, is located or arranged between the first and the second portions 110-1 and 110-2 and is thus arranged adjacent to the first magneto-resistive sensor element 130-1 as well as adjacent to the second magneto-resistive sensor element 130-2. In a typical integrated circuit, the first portion 110-1 of the magneto-resistive stack 110 can be separated from the third portion 110-3 of the magneto-resistive stack 110 by an isolating or insulating material 150, such as oxide or nitride. Likewise, the third portion 110-3 of the magneto-resistive stack 110 can be separated from the second portion 110-2 of the magneto-resistive stack 110 by the insulating material 150. The third portion 110-3 of the magneto resistive stack 110 and thus the shield element 140 is operable as an electric shield between the at least one first magneto-resistive sensor element 130-1 and the at least one second magneto-resistive sensor element 130-2.

A possible fabrication of integrated sensor circuit 100 will now be explained with reference to FIGS. 2a and 2b.

FIG. 2a illustrates a semiconductor arrangement 200 including a semiconductor substrate 202. One or more layers of insulation material 150 may be deposited above semiconductor substrate 202. A plurality of metal lines 120-2 may have been formed within the insulation material 150. Vias or cuts 160 connect the metal lines 120-2 to magneto-resistive stack 110 which is deposited on top of the insulation material 150 and the metal 120-2. A photo-mask (photoresist) 204 is deposited on the magneto-resistive stack 110 to pattern portions of the magneto-resistive stack 110, for example, using well-known etching techniques.

A result of the patterning process is depicted in FIG. 2b illustrating the three separate stack portions 110-1, 110-2, and 110-3 as basis for the respective sensor and shield elements 130-1, 130-2, and 140. Etched gaps or trenches 206 between the separate stack portions 110-1, 110-2, and 110-3 may be filled with the insulation material 150 (e.g., SiO$_2$), for example.

Thus, embodiments also provide a method for fabricating an integrated sensor device 100. The method comprises forming a magneto-resistive stack 110 of ferromagnetic and non-magnetic layers on a common substrate 202, forming at least one first magneto-resistive sensor element 130-1 in a first section 110-1 of the magneto-resistive stack 110, forming at least one second magneto-resistive sensor element 130-2 in a separate second section 110-2 of the magneto-resistive stack 110, and forming a shield element 140 operable as an electric shield between the at least one first and the at least one second magneto-resistive sensor element 130-1, 130-2 in a separate third section 110-3 of the magneto-resistive stack 110 between the first and the second sections 110-1, 110-2. The fabricating method can further include separating the first section 110-1 from the third section 110-3 of the magneto-resistive stack by an insulating material 150, and separating the third section 110-3 of the magneto-resistive stack from the second section 110-2 of the magneto-resistive stack by the insulating material 150. The skilled person having benefit from the present disclosure will appreciate that further integrated circuitry, such as, for example, readout circuitry associated with the at least one first magneto-resistive sensor element 130-1 may also be integrated in or on the common substrate 202. Likewise, readout circuitry associated with the at least one second magneto-resistive sensor element 130-2 may be further integrated in the common substrate 202.

Turning back to the examples of FIGS. 1a and 1 b, the first magneto-resistive sensor element 130-1, the second magneto-resistive sensor element 130-2 as well as the shield element 140 are electrically contacted in CPP configuration from the top and the bottom by respective vias or cuts 160 extending through insulating material 150. Vias 160 electrically couple the first magneto resistive sensor element 130-1, the second magneto-resistive sensor element 130-2, and the shield element 140 to respective associated upper and lower metal layers or lines 120-1, 120-2. As mentioned above, first magneto-resistive sensor element 130-1, the second magneto-resistive sensor element 130-2, and the shield element 140 could also be contacted from one side only (top, bottom) for CIP configurations, for example.

The first magneto-resistive sensor element 130-1 may be implemented standalone or be part of more complex first magneto-resistive sensor circuitry. Likewise, the second magneto-resistive sensor element 130-2 may be implemented standalone or be part of more complex second magneto-resistive sensor circuitry. Such magneto-resistive sensor circuitry may comprise Wheatstone or similar bridge circuits to detect magnetic fields and/or changes of magnetic fields. As will be appreciated by the skilled person having benefit from the present disclosure, the first magneto-resistive sensor element 130-1 and the second magneto-resistive sensor element 130-2 may be coupled to respective integrated readout circuits (not shown). Furthermore, the first magneto-resistive sensor element 130-1 and the second magneto-resistive sensor element 130-2 or their respective integrated readout circuits may be coupled to verification circuitry which may be configured to compare a first sensor signal generated by the first magneto-resistive sensor element 130-1 against a second sensor signal generated by the second magneto-resistive sensor element 130-2 in response to a magnetic field applied to a respective sensing layer (e.g., free layer) of the first and the second magneto-resistive sensor elements. This may be particularly relevant for safety-critical applications where the integrated sensor circuit 100 may be used as a dual sensor IC. In such embodiments, the first magneto-resistive sensor element 130-1 and the second magneto-resistive sensor element 130-2 would be configured to sense the same magnetic field independently from each other. For example, one magneto-resistive sensor element could measure the x-component of the magnetic field, while the other measures the y-component of the magnetic field. In such cases, circuitry associated with the first magneto-resistive sensor element 130-1 may be supplied or operated via a first supply voltage, while circuitry associated with the second magneto-resistive sensor element 130-2 may be supplied via an independent second supply voltage.

FIG. 1b depicts a top-view of the sensor arrangement of FIG. 1a.

As can be seen from the example of FIG. 1b, the upper and lower metal lines 120-1 and 120-2 in contact with the first and the second magneto-resistive sensor element 130-1, 130-2 are not only spatially displaced in z-direction, but may also be spatially displaced in y-direction, while the may extend in parallel in x-direction. The first magneto-resistive sensor element 130-1 and the second magneto-resistive sensor element 130-2 may extend essentially in parallel in y-direction between their respectively associated upper and lower metal lines 120-1, 120-2. Both magneto-resistive sensor elements 130-1, 130-2 may be coupled to respective contact pads 171, 172 and/or further integrated circuitry (for example, readout circuitry) via their associated upper and lower metal lines 120-1, 120-2.

The upper and lower metal lines 120-1, 120-2 associated with shield element 140 as well as the shield element 140 itself extend in y-direction between the first and the second magneto resistive sensor elements 130-1, 130-2 in the illustrated example. Thus, the shield element 140 may extend essentially in parallel to and in between the magneto-resistive sensor elements 130-1, 130-2. Here, the shield element 140 is coupled to its associated upper and lower metal lines 120-1, 120-2 by a plurality of vias 160 between the respective metal line 120-1 or 120-2 and the shield element 140. The plurality of vias 160 may form an additional via grid or shield between the first and the second magneto-resistive sensor elements 130-1, 130-2.

During (normal) operation of the integrated sensor circuit 100, the first magneto-resistive sensor element 130-1 and the second magneto-resistive sensor element 130-2 may be operated to sense respective magnetic fields or the same magnetic field in case of redundant sensor concepts. For this purpose, both magneto-resistive sensor elements 130-1, 130-2 may for example be coupled to between a supply potential and ground (GND) using respective contact pads 171-1, 172-1 and 171-2, 172-2. During said normal operation, the electric potential of shield element 140 may be set or pulled to ground (GND) using one or more associated contact pads 173. Thus, an electric shield between the magneto-resistive sensor elements 130-1, 130-2 may be provided by (magneto-resistive) shield element 140 during normal operation of the integrated sensor circuit 100. Shield element 140 may avoid short circuits and thus current leakage between the magneto-resistive sensor elements 130-1, 130-2.

A short circuit between the magneto-resistive sensor elements 130-1, 130-2 may be caused, for example, by a conductive particle (e.g., extrinsic defect) which remains in the insulating material 150 during production. Sometimes such conductive particles are not detected during a test (screening) which may be carried out before delivering the integrated circuit 100 on account of its small size. The conductive particle may therefore be initially an undetected sleeping fault. Due to different influences, for example aging, temperature, moisture or corrosion, the conductive particle may increase in size over time and may then cause a short circuit between in principle separate conductors. The undetected sleeping fault may cause a module which contains the integrated circuit 100 and which is initially delivered to a customer without faults to have a defect within a normal operating period. An undetected sleeping fault can also be caused, for example, during production by incorrect processing during Chemical Mechanical Polishing (referred to as "CMP" in abbreviated form).

A conductive particle may be located inside the integrated sensor circuit 100, for example in the region near the first magneto-resistive sensor element 130-1. Due to its small size, the conductive particle is not immediately detected after production of the integrated sensor circuit 100 and thus the integrated sensor circuit 100 is completely functional. The conductive particle may increase in size over time until it makes contact with both the first magneto-resistive sensor element 130-1 and the shield element 140. Contact between the conductive particle and the first magneto-resistive sensor element 130-1 and the shield element 140 may cause current flow (leakage current) between the first magneto-resistive sensor element 130-1 and the shield element 140. However, this leakage current does not reach the second magneto-resistive sensor element 130-2 and thus does not harm the integrated sensor circuit 100.

In some embodiments, leakage current between any of the first or the second magneto-resistive sensor element 130-1, 130-2 and the shield element 140 may be detected by optional leakage detection circuitry coupled to the shield element 140. For example, one electrical contact terminal of shield element 140 could be coupled to ground, while the another electrical contact terminal of shield element 140 could be coupled to the leakage detection circuitry. The leakage detection circuitry may be configured, for example by using a shunt resistor, to detect leakage current between the shield element 140 and at least one of the first and the second magneto-resistive sensor element 130-1, 130-2. For example, a portion of the third section 110-3 of the magneto-resistive stack 110 and thus a portion of the shield element 140 could be configured as a shunt resistor. A conductive extrinsic defect can therefore detected even before a short circuit can occur between the magneto-resistive sensor elements 130-1, 130-2.

Inside the integrated sensor circuit 100, a sleeping fault, for example a conductive particle, may be uncovered in good time. The sleeping fault can be uncovered as soon as a leakage current from the first magneto-resistive sensor element 130-1 to the shield element 140 or from the second magneto-resistive sensor element 130-2 to the shield element 140 occurs. The sleeping fault may therefore be detected even before a short circuit or leakage occurs between the first magneto-resistive sensor element 130-1 and the second magneto-resistive sensor element 130-2. The sleeping fault may be detected at a time in which the integrated sensor circuit 100 is still completely functional, that is to say before a hazard in the integrated circuit arrangement 100 occurs. For example, the sleeping fault may be avoid and/or detected before the second magneto-resistive sensor element 130-2 or a circuit connected to the second magneto-resistive sensor element 130-2 is destroyed on account of the short circuit. A "hazard" may therefore be prevented.

The shield element 140 and optional leakage detection circuitry can ensure functional safety of the integrated sensor circuit 100. Since the (magneto-resistive) shield element 140 and the evaluation circuit 118 may have a low area requirement, it is possible to ensure the functional safety in an efficient manner inside the integrated sensor circuit 100.

Shield element 140 and optional leakage detection circuitry may be dedicated to prevent or detect sleeping faults. In other words, shield element 140 does not undertake any logic function during normal operation of integrated sensor circuit 100 in some embodiments. For example, shield element 140 may not be involved in any logical operation of integrated sensor circuit 100. During normal operation of integrated sensor circuit 100, that is to say when a short circuit is not present, there may be no electrical connection between shield element 140 and further functional elements of integrated sensor circuit 100. For example, there may be no electrical connection between shield element 140 and first magneto-resistive sensor element 130-1 or between shield element 140 and second magneto-resistive sensor element 130-2. There may likewise be no electrical connection between the first magneto-resistive sensor element 130-1 and the optional leakage detection circuitry and between the second magneto-resistive sensor element 130-2 and the leakage detection circuitry.

According to embodiments of the present disclosure, the shield element 140 may not only be useful during normal operation of integrated sensor circuit 100 including the at least one first and the at least one second magneto-resistive sensor element 130-1 and 130-2, but also during testing or screening the integrated sensor circuit 100 during or after fabrication of the integrated sensor circuit 100. In some embodiments, the integrated sensor circuit 100 may thus also be operated in a screening mode.

During the screening mode of integrated sensor circuit 100, electrical connectors 173 of shield element 140 can be coupled to a screening voltage for accelerated activation of extrinsic defects. On the other hand, respective electrical connectors of the first and the second magneto-resistive sensor element 130-1, 130-2 can be coupled to ground during the screening mode, for example. In other words, the first and/or the second magneto-resistive sensor element 130-1, 130-2 may be pulled to a defined potential (preferably GND). In case of an integrated circuit this can be done by switches that are activated in the screening mode. In case of a simple basic XMR element which does not include active circuitry, this can be done by test equipment. The screening voltage may be applied to the shield element 140 (the screening voltage should be as high as possible in order to accelerate the activation of extrinsic defects) and kept for a certain time (the higher the voltage the shorter the time to achieve the same level of certainty for the test result (accelerated lifetime test to activate early live time faults (bath tub curve). Optionally it can be measured if a leakage appears between at least one magneto-resistive sensor element 130-1 and 130-2 and the shield element 140.

Thus, a potential difference corresponding to the screening voltage may be generated between shield element 140 and any of the first and the second magneto-resistive sensor elements 130-1, 130-2. Thereby, the screening voltage may be larger than a supply potential used for normally operating the first and/or the second magneto-resistive sensor element 130-1, 130-2. However, the screening supply potential may at the same time be lower than a breakdown voltage of one or more Electrostatic Discharge (ESD) circuits associated with the shield element 140 and/or the first magneto-resistive sensor element 130-1 and/or the second magneto-resistive sensor element 130-2. Typically the magnitude of the screening voltage will depend on the supply potential used for normally operating the first and/or the second magneto-resistive sensor element 130-1, 130-2 and/or an available screening time. For example, the screening voltage applied to the shield element during screening may be in the range 5V to 30V or even up to 60V in some embodiments.

Figure 3:
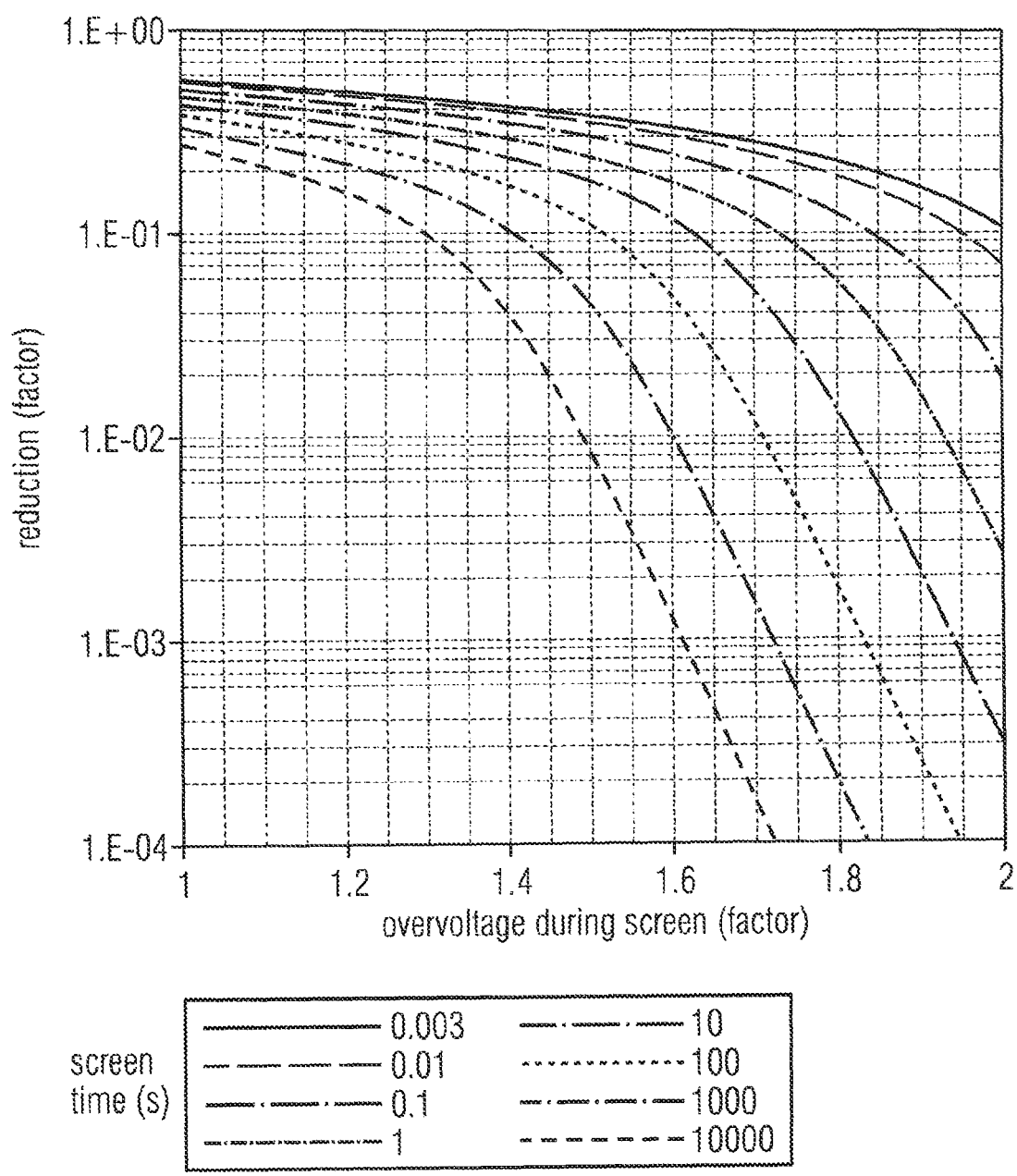
FIG. 3 shows a relationship between the reduction of extrinsic defects, screening time, and screening voltage.

A relationship between the reduction of extrinsic defects, screening time, and screening voltage is depicted in FIG. 3. As can be qualitatively seen from FIG. 3, the reduction of extrinsic defects increases both with screening time and the screening voltage applied during the screening mode. For example, applying a screening voltage twice the normal supply voltage for one second can reduce extrinsic defects by a factor of approximately 100.

During normal fabrication test on wafer level and/or during normal operation (sensing mode), the shield element 140 can be connected or pulled to a defined potential (typically GND) and can optionally be connected to leakage detection circuitry, which may also be referred to as shield monitor. In case of an integrated circuit this can be done by switches that are activated in sensing mode. In case of a simple basic XMR element which does not include active circuitry it may be done by bonding the shield pad 173 to one of the XMR supply pins, or may be done on Printed Circuit Board (PCB) level in the application. In the latter case this may also allow leakage detection e.g. by pulling the shield pin to GND via a large resistor (e.g. 100MΩ) and monitor the voltage drop across the resistor e.g. with a microcontroller Analog-to-Digital Converter (ADC). Afterwards, a normal fabrication test of a packaged device may follow.

To switch between the different modes of operation (screening, normal fabrication test, or sensing mode) the integrated sensor device 100 may further comprise analog and/or digital switching circuitry which is configured to couple or pull electrical connectors 173 of the shield element 140 to a reference potential (GND) during operation of the at least one first and the at least one second magneto-resistive sensor element 130-1, 130-2 and configured to couple or pull the electrical connectors 173 of the shield element 140 to the screening voltage during the screening mode of the integrated circuit 100. The switching circuitry can be further configured to couple or pull respective electrical connectors 171, 172 of the at least one first and the at least one second magneto-resistive sensor element 130-1, 130-2 to the reference potential during the screening mode. During operation of the at least one first and the at least one second magneto-resistive sensor element, i.e., during normal fabrication test on wafer level and/or during normal operation (sensing mode), the switching circuitry can be configured to couple the at least one first and the at least one second magneto-resistive sensor element 130-1, 130-2 between a respective supply potential and the reference potential.

Figure 4:
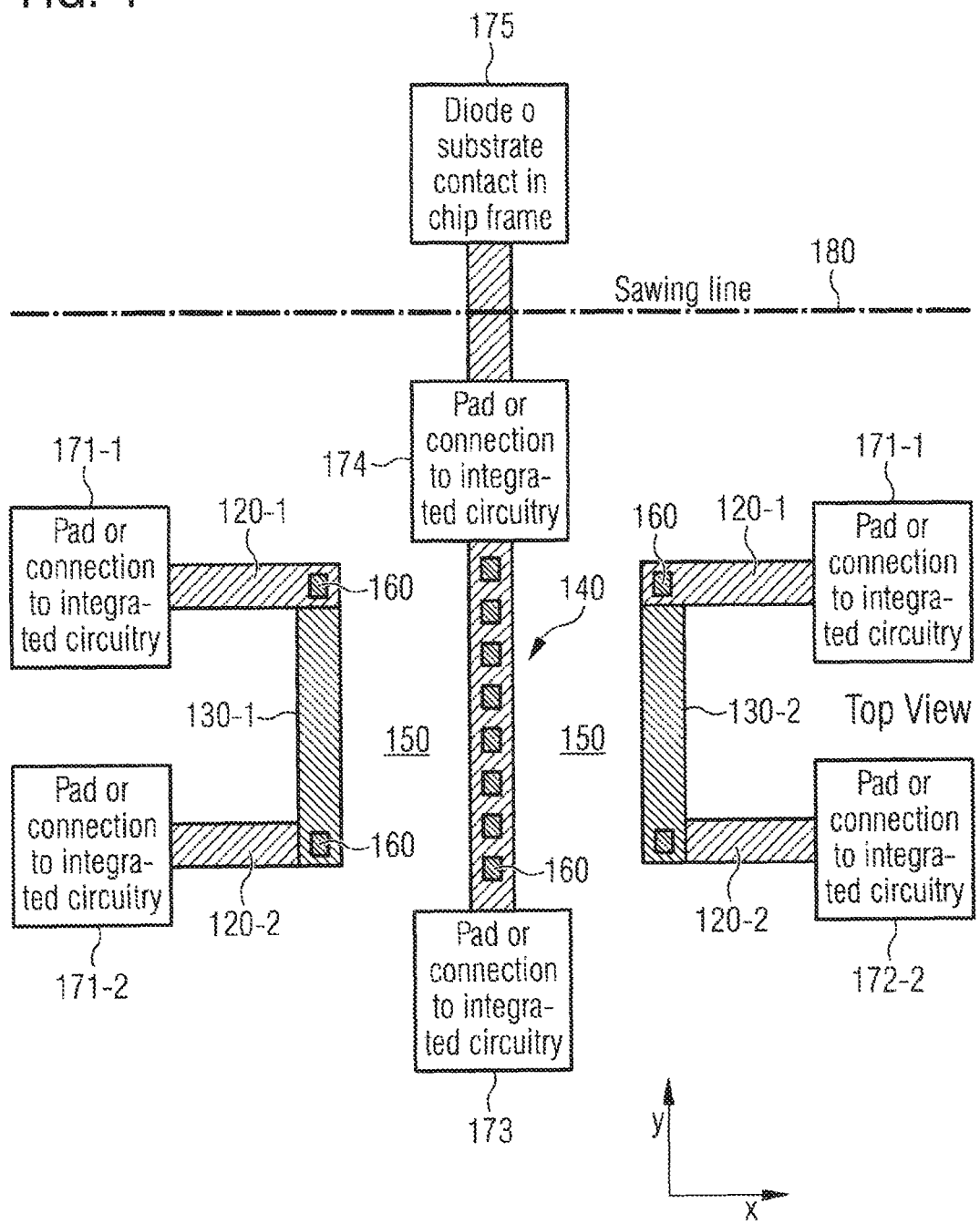
FIG. 4 shows a top view of a portion of an integrated sensor circuit according to a further example embodiment.

Another example embodiment of integrated sensor circuit 100 is illustrated in FIG. 4.

Here, the integrated circuit differs from the one depicted in FIG. 1*b* in that the shield element 140 can be coupled between two contact pads 173 and 174 located at opposite ends of shield element 140 along its axis in y-direction (lengthwise). Recall that the XMR layers of shield element 140 are stacked on top of each other in z-direction (height) and the first and second magneto-resistive sensor element 130-1 and 130-2 are adjacent to shield element 140 in x-direction (width). Thus, the contact pads 173 and 174 are located for allowing a Current-In-Plane (CIP) along the layers of shield element 140. With the arrangement of FIG. 4 cracks extending in the semiconductor material or the magneto-resistive stack portion 110-3 of shield element 140 may be detected. For that purpose a voltage or a current may be applied to contact pad 174, for example, while contact pad 173 may be coupled to ground. In this case and under normal conditions, a certain current would flow through shield element 140 lengthwise in y-direction essentially in parallel to the plane of the layers of the stack portion 110-3. In presence of a crack, however, the current between pads 173 and 174 would be smaller than expected, possibly even zero. Thus, in some embodiments, the shield element 140 can be coupled between a first electrical contact 173 and a second electrical contact 174 and can be configured to detect cracks in the magneto-resistive stack 110 based on evaluating an electrical current through the shield element 140 in response to a crack detection voltage or current applied between the first and the second electrical contact during a test mode.

Optionally, the shield element 140 can also be coupled or pulled to ground potential for fabrication purposes, for example to prevent the antenna effect during plasma etching. Thus, during fabrication of integrated sensor circuit 100, the test/shield line associated with shield element 140 can be connected to ground pad 175 outside a sawing line 180 to connect one or more electrical contacts of the shield element 140 to ground potential during plasma etching. After fabrication, integrated sensor circuit 100 can be singularized by sawing the IC along sawing line 180. The antenna effect or plasma induced gate oxide damage is an effect that can potentially cause yield and reliability problems during the manufacturing of integrated circuits. Presently lithographic processes for IC fabrication use plasma etching dry etching. Plasma is an ionized/reactive gas used to etch. It allows good control of pattern (shaper edges/less undercut) and also allows several chemical reactions that are not possible in traditional (wet) etch. However, several unwanted effects also accumulate. One of them is charging damage. Plasma charging damage refers to unintended high-field stressing during plasma processing. During plasma etching high amount of charge can collect on polysilicon and metal surfaces. Through capacitive coupling, large electric fields may develop, resulting in stresses that cause oxide breakdown and shifts in threshold voltage of the device. The collected charges can be neutralized by current tunneling to ground pad 175.

Figure 5:
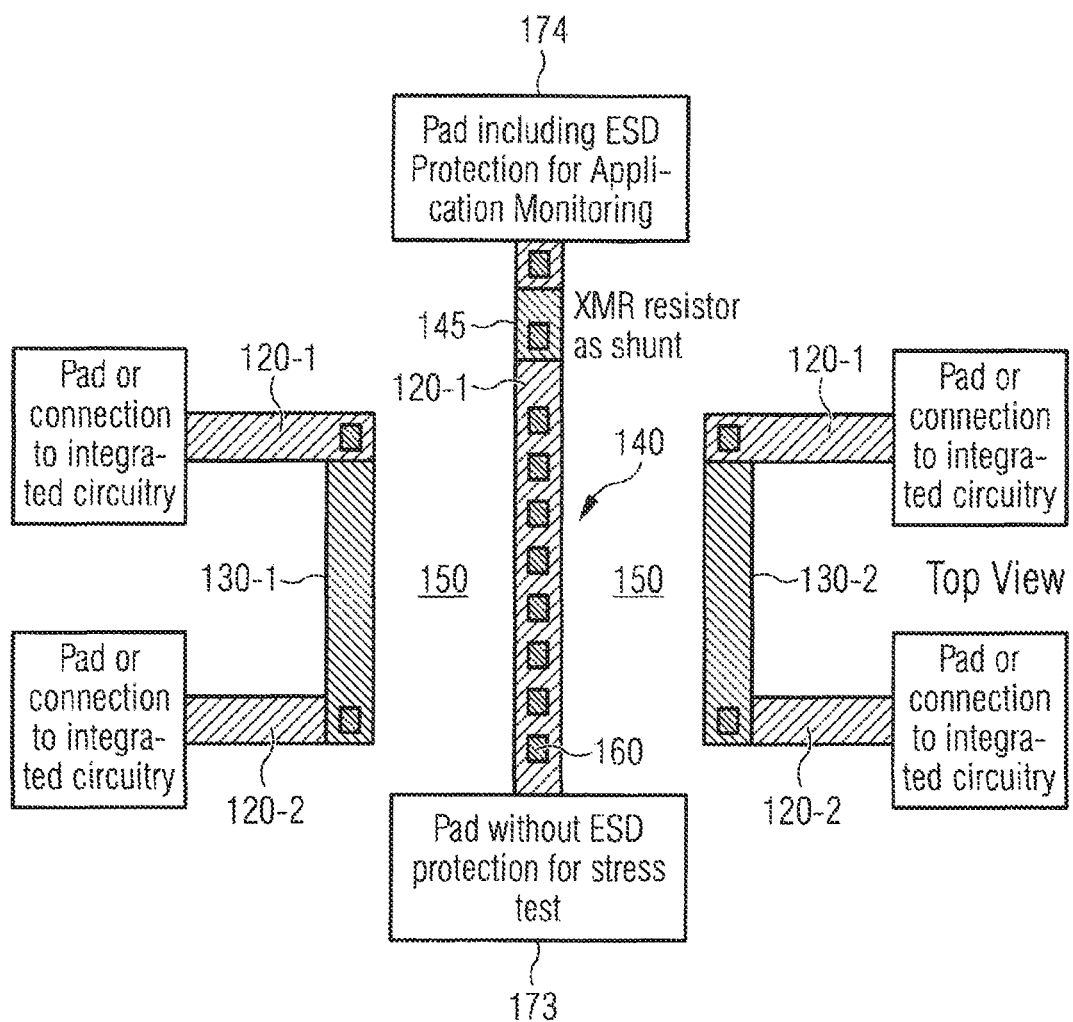
FIG. 5 shows a top view of a portion of an integrated sensor circuit according to a further example embodiment.

A further embodiment of integrated sensor circuit 100 is shown in FIG. 5. Here, a portion of the third section 110-3 of the magneto-resistive stack and hence a portion of the shield element 140 is configured as an integrated shunt resistor 145 to add voltage drop on top of an ESD breakdown voltage of ESD circuitry to accelerate electrical stress tests. This possibility has already been mentioned before. The shunt 145 may be used instead of an external resistor as detection element to create voltage drop in case of current leakage between any of the first or the second magneto-resistive sensor element 130-1 and the shield element 140. A size of the integrated shunt resistor 145 can be adjusted by appropriately selecting vias 160 (for example, their distance) for electrically contacting the relevant shunt portion of the third section 110-3. In the example of FIG. 5, pad 174 may be used for leakage detection during normal fabrication test on wafer level and/or during normal Operation (sensing mode), while pad 173 may be used for stress test during screening mode of integrated circuit 100.

To summarize, FIG. 6 shows a flow chart of a method 600 operating an integrated sensor device 100. During normal fabrication test on wafer level and/or during normal operation of the at least one first and the at least one second magneto-resistive sensor element 130-1, 130-2 (sensing mode), the method 600 connects (act 610) the shield element 140 to a reference potential (e.g., ground) and/or to leakage detection circuitry to detect leakage current between the shield element 140 and at least one of the first and the second magneto-resistive sensor element. Method 600 further connects (act 620) the at least one first magneto-resistive sensor element 130-1 and the at least one second magneto-resistive sensor element 130-2 to a supply potential and optionally to respective readout circuitry during operation of the at least one first and the at least one second magneto-resistive sensor element 130-1, 130-2.

During an optional stress or screening mode of the integrated sensor device, method 600 can connect (act 630) all electrical contacts of the at least one first magneto-resistive sensor element 130-1 and of the at least one second magneto-resistive sensor element 130-2 to a common reference potential (e.g., ground). Method 600 can further connect (act 640) the shield element 140 to a screening voltage which may be higher than an operating supply voltage used for operating the first and/or the second magneto-resistive sensor element 130-1, 130-2.

To summarize, embodiments provide XMR structures that allow to apply increased voltage stress to allow accelerated activation of extrinsic defects in an oxide and to reconfigure it afterwards to serve as a shield between redundant XMR elements.

The description and drawings merely illustrate the principles of the disclosure. It will thus be appreciated that those skilled in the art will be able to devise various arrangements that, although not explicitly described or shown herein, embody the principles of the disclosure. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. An integrated circuit comprising a magneto-resistive stack of ferromagnetic and non-magnetic layers formed on a common substrate, the integrated circuit comprising:

at least a first magneto-resistive sensor element on the common substrate and provided by a first section of the magneto-resistive stack of ferromagnetic and non-magnetic layers;

at least a second magneto-resistive sensor element on the common substrate and provided by a separate second section of the magneto-resistive stack of ferromagnetic and non-magnetic layers, wherein the separate second section of the magneto-resistive stack is laterally disposed from the first section of the magneto-resistive stack; and at least one shield element provided by a separate third section of the magneto-resistive stack, wherein the separate third section is laterally arranged between the first section and the second section, and wherein the shield element is configured to operate as an electric shield between the at least one first and the at least one second magneto-resistive sensor elements, wherein the first section of the magneto-resistive stack is separated from the third section of the magneto-resistive stack by an insulating material and wherein the third section of the magneto-resistive stack is separated from the second section of the magneto-resistive stack by an insulating material.

2. The integrated circuit of claim 1, wherein the at least one first magneto-resistive sensor element and the at least one second magneto-resistive sensor element are configured to sense the same magnetic field independently from each other.

3. The integrated circuit of claim 1, further comprising one or more electrical connectors to at least one of the first magneto-resistive sensor element, the second magneto-resistive sensor element, or the shield element, wherein the one or more electrical connectors are configured as an interface from the integrated circuit to an external circuit.

4. The integrated circuit of claim 1, further comprising at least one common contact pad shared by the first and the second magneto-resistive sensor elements.

5. The integrated circuit of claim 1, further comprising switching circuitry configured to:
couple electrical connectors of the shield element to a reference potential during operation of the at least one first and the at least one second magneto-resistive sensor element, and
couple the electrical connectors of the shield element to a screening potential during a screening mode of the integrated circuit.

6. The integrated circuit of claim 5, wherein the switching circuitry is configured to couple respective electrical connectors of the at least one first and the at least one second magneto-resistive sensor element to the reference potential during the screening mode.

7. The integrated circuit of claim 5, wherein the switching circuitry is configured to couple the at least one first and the at least one second magneto-resistive sensor elements to a respective supply potential during operation of the at least one first and the at least one second magneto-resistive sensor element, wherein the at least one first and the at least one second magneto-resistive sensor elements are configured to sense a magnetic field during operation of the at least one first and the at least one second magneto-resistive sensor element, respectively.

8. The integrated circuit of claim 5, wherein the screening potential is larger than a supply potential used for operating the first and/or the second magneto-resistive sensor element but lower than a breakdown voltage of one or more electrostatic discharge circuits associated with the shield element and/or the at least one first magneto-resistive sensor element and/or the at least one second magneto-resistive sensor element.

9. The integrated circuit of claim 1, wherein the shield element is coupled to at least one metal layer of the integrated circuit by a plurality of vias between the at least one metal layer and the shield element, the plurality of vias forming a via grid between the at least one first and the at least one second magneto-resistive sensor element.

10. The integrated circuit of claim 1, further comprising:
leakage detection circuitry coupled to the shield element and configured to detect leakage current between the shield element and at least one of the first and the second magneto-resistive sensor elements.

11. The integrated circuit of claim 1, wherein the shield element is coupled between a first electrical contact and a second electrical contact and configured to detect cracks in the magneto-resistive stack based on evaluating an electrical current through the shield element or a voltage drop across the shield element in response to a crack detection voltage or a crack detection current applied between the first and the second electrical contacts during a test mode.

12. The integrated circuit of claim 1, wherein a portion of third section of the magneto-resistive stack is configured as a shunt resistor.

13. The integrated circuit of claim 1, further comprising:
verification circuitry configured to compare a first sensor signal generated by the at least one first magneto-resistive sensor element against a second sensor signal generated by the at least one second magneto-resistive sensor element in response to a magnetic field applied to a respective sensing layer of the at least one first and at least one second magneto-resistive sensor elements.

14. The integrated circuit of claim 1, wherein the at least one first and the at least one second magneto-resistive sensor elements are configured as AMR, GMR, or TMR sensor elements.

15. A circuit comprising a stack of ferromagnetic and non-magnetic layers formed on a common substrate, the circuit comprising:
at least a first magneto-resistive sensor element provided by a first section of the layer stack;
at least a second magneto-resistive sensor element provided by a separate second section of the layer stack; and
at least one shield element provided by a separate third section of the layer stack between the first and the second sections, wherein the shield element is operable as an electric shield between the at least one first and the at least one second magneto-resistive sensor elements during operation of the at least one first and the at least one second magneto-resistive sensor elements; and
switching circuitry configured to:
pull the shield element to ground during operation of the at least one first and the at least one second magneto-resistive sensor elements, and
pull the shield element to a screening potential during a screening mode of the integrated circuit.

16. The circuit of claim 15, wherein the shield element comprises the same ferromagnetic and non-magnetic layers of the layer stack as the first and second magneto-resistive sensor elements.

17. A method for operating an integrated sensor device comprising a magneto-resistive stack of ferromagnetic and non-magnetic layers formed on a common substrate, the sensor device comprising at least a first magneto-resistive sensor element provided by a first section of the magneto-resistive stack, at least a second magneto-resistive sensor element provided by a separate second section of the magneto-resistive stack, and at least one shield element provided by a separate third section of the magneto-resistive stack between the first and the second sections, the method comprising, during operation of the at least one first and the at least one second magneto-resistive sensor elements:

connecting the shield element to a reference potential and/or to leakage detection circuitry to detect leakage current between the shield element and at least one of the first and the second magneto-resistive sensor elements; and connecting the at least one first magneto-resistive sensor element and the at least one second magneto-resistive sensor element to a supply potential.

18. The method of claim 17, further comprising, during a screening mode of the integrated sensor device:

pulling the at least one first magneto-resistive sensor element and the at least one second magneto-resistive sensor element to a common reference potential;

pulling the shield element to a screening voltage higher than an operating supply voltage used for operating the first and/or the second magneto-resistive sensor element.

19. The method of claim 18, in response to the applied screening voltage, checking for leakage current between the shield element and at least one of the first and the second magneto-resistive sensor elements during the screening mode.

20. The method of claim 17, further comprising, during a test mode of the integrated sensor device:

electrically coupling the shield element between a first electrical contact and a second electrical contact;

applying a crack detection voltage between the first and the second electrical contacts; and detecting cracks in the magneto-resistive stack based on evaluating an electrical current through the shield element in response to the crack detection voltage.

* * * * *